Klüpfel et al.

[54] PHOTOPOLYMERIZABLE TRANSFER MATERIAL

[75] Inventors: Kurt Klüpfel, Wiesbaden-Sonnenberg; Heide Sprengel, Wiesbaden-Biebrich, both of Fed. Rep. of Germany

[73] Assignee: Hoechst Aktiengesellschaft, Germany, Fed. Rep. of Germany

[21] Appl. No.: 4,124

[22] Filed: Jan. 17, 1979

Related U.S. Application Data

[63] Continuation of Ser. No. 802,410, Jun. 1, 1977, abandoned, which is a continuation of Ser. No. 621,578, Oct. 10, 1975, abandoned.

[30] Foreign Application Priority Data

Oct. 14, 1974 [DE]  Fed. Rep. of Germany ....... 2448850

[51] Int. Cl.² .................... G03C 1/63; G03C 1/78
[52] U.S. Cl. ................................ 430/271; 430/273; 430/281; 430/905; 204/159.15
[58] Field of Search ............. 96/115 R, 115 P, 35.1, 96/28, 86 P, 87 R; 204/159.15; 430/271, 273, 281, 905

[56] References Cited

U.S. PATENT DOCUMENTS 3,853,727  12/1974  Wrzesinski .................. 96/115 P
3,873,316  3/1975   Velten et al. ................. 96/115 R

FOREIGN PATENT DOCUMENTS 2028773  12/1971  Fed. Rep. of Germany .......... 96/86 P Primary Examiner—Jack P. Brammer
Attorney, Agent, or Firm—James E. Bryan

[57] ABSTRACT

This invention relates to an improvement in a photopolymerizable transfer material comprising a flexible base, and a thermoplastic photopolymerizable copying layer, the improvement comprising including an adhesion-imparting substance at the boundary of said copying layer away from said base, said substance having the formula

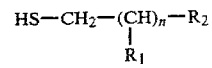

in which
  n is 0 or an integer from 1 to 3,
  $R_1$ is H or OH,
  $R_2$ is H or $COOR_3$, and
  $R_3$ is an alkyl group having about 1 or 25 carbon atoms.

13 Claims, No Drawings

PHOTOPOLYMERIZABLE TRANSFER MATERIAL

This is a continuation of application Ser. No. 802,410, filed June 1, 1977, now abandoned, in turn, a continuation of Ser. No. 621,578, filed Oct. 10, 1975, now abandoned.

This invention relates to a process for applying a photopolymerizable copying layer to a support composed of copper or a copper alloy. Application may be accomplished by coating with a solution of the copying layer components and drying the resulting layer, or by the dry transfer of a pre-fabricated copying layer disposed on a temporary flexible base.

It is known to apply, either by a wet or by a dry process, light-sensitive layers, especially photoresist layers, to a permanent support of metal, especially copper, where the layer is then image-wise exposed and developed and the bared areas of the support are finally modified by the application or removal of metal. The process is used in particular for the preparation of printed circuits, but also for the photomechanical preparation of gravure or multi-metal printing plates obtained by image-wise etching of copper-based supports.

In the processing of photoresist layers, especially photopolymerizable layers, on copper supports, the frequently unsatisfactory adhesion of the layers to the supports presents a great problem. This is particularly evident when the photoresist layer is formed of very fine, insulated particles and is then used as an etching or electroplating resist. In this case, it may happen that the processing solutions penetrate beneath fine portions of the layer and may even separate them from the support.

Several suggestions have been made to eliminate this drawback by adding adhesion-improving substances. Thus, U.S. Pat. No. 3,622,334 discloses a photopolymerizable layer capable of a dry transfer which contains certain N-heterocyclic compounds to improve its adhesion to metal supports.

U.S. Pat. No. 3,645,772, discloses a process for improving the adhesion of a photoresist layer on copper supports, in which the support is closed, before application of the photoresist layer, with a thin intermediate layer comprising an organic nitrogen compound which also may contain mercapto groups.

German Offenlegungsschrift No. 2,028,773, discloses mercapto compounds as adhesion-imparting agents between photo-hardenable copying layers and copper supports. The adhesion imparting agents may be present either in the copying layer or as a separate intermediate layer. Heterocyclic compounds containing mercapto groups, e.g. mercapto benzthiazole, but also the mercapto acetic acid 2-naphthyl amide, are described as particularly useful adhesion-imparting agents. The latter compound is named, as the only representative of its class, on page 6 of the German Offenlegungsschrift. No details are given of its effect and application.

The German Offenlegungsschrift discloses only the application of layers from a solution, especially of photo-hardenable diazo layers. Now it has been found that adhesion problems occur in particular in the dry transfer process, because layers applied by this process do not seem to have the degree of adhesion to the support attained by layers applied from a solution. Further, it was found that photopolymerizable layers have particular adhesion problems after exposure, because they are always more brittle in the polymerized, hardened state than they are in the unexposed state. The increased brittleness may result in an easier undercutting of the image areas by etching or electroplating solutions and may even cause portions of the layers to break away. On the other hand, photoresist layers intended for a dry transfer process, also designated as dry resist layers, must not be too soft in the unexposed state, because otherwise they would display an undesired cold flow during storage, especially in the case of relatively thick layers.

Both, when used as components of a layer and as a separate intermediate layer, the hitherto known adhesion-imparting agents are not effective enough to anchor photopolymerizable layers so safely to copper supports that the photoresist produced therefrom is sufficiently resistant to corrosive etching and electroplating baths.

Further, the known adhesion-imparting agents have the disadvantage that they have a certain tendency to crystallize from the photopolymer layer during storage. This tendency also exists when they are used in the form of an intermediate layer between the support and the photopolymer layer and in this case may cause a separation of the layer by crystallization at the boundary surface when the copper support carrying the light-sensitive coating is stored for a relatively long time.

It is the object of the present invention to provide new adhesion-imparting substances for the purpose described, which are at least equal in their effect to known adhesion-imparting agents and exhibit no crystallization tendencies.

The invention is based on a process for providing a support composed of copper or a copper alloy with a photopolymerizable copying layer containing, as the essential components, a polymeric binder, a polymerizable compound which is non-volatile at temperatures below 100° C. and contains at least one vinyl or vinylidene group, and a photopolymerization initiator, in which process an aliphatic mercapto compound is either added to the copying layer as an adhesion-imparting substance, or is applied as an intermediate layer between the copying layer and the support.

In the process according to the invention, the adhesion-imparting substance is a compound of the general formula

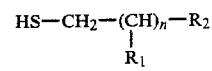

wherein
n is 0 or an integer from 1 to 3,
$R_1$ is H or OH,
$R_2$ is H or $COOR_3$, and
$R_3$ is an alkyl group with 1 to 25 carbon atoms.

Further, the present invention relates to a photopolymerizable transfer material comprising a flexible base, a thermoplastic photopolymerizable copying layer, and, if desired, a peelable protective coating on the surface of the copying layer away from the base. An adhesion-imparting substance of the general formula

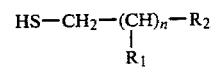

wherein n, $R_1$, and $R_2$ have the meanings indicated above, is contained in the photopolymerizable layer, either uniformly distributed in the layer, or in the form of a top coating on the surface away from the base.

Straight-chained or branched, saturated or unsaturated aliphatic hydrocarbon radicals may be used as substituents $R_3$. Saturated alkyl groups, especially those containing from 10 to 20 carbon atoms, are preferred. $R_1$ preferably is hydrogen and n preferably is 0, 1, or 2. When n is 0, or $R_1$ is H, $R_2$ preferably is COOR$_3$.

Both, in layers applied in the form of liquid solutions to copper supports, as also in layers laminated to copper supports by a dry transfer process, the new adhesion-imparting substances are very effective. In comparison with known adhesion-improving agents, their effect is particularly conspicuous in the latter process, because in this case adhesion poses the greater problem.

As already mentioned, the adhesion-imparting substances may be either incorporated in the photopolymerizable copying layer, or used in the form of a separate intermediate layer between the copper support and the copying layer. Which of these possibilities is selected largely depends on which is more advantageous in each individual case. Incorporation in the layer saves a process step, but the effect of the same quantity per unit of surface area is more pronounced when the substance is concentrated at the boundary layer. In the case of relatively expensive adhesion-imparting substances, it is therefore preferred to use them in the form of a separate layer. The separate layer may be easily applied after the customary preliminary cleaning of the copper surface. Alternatively, it is also possible to apply the adhesion-imparting layer to the surface of the photopolymerizable layer during the manufacture of the dry resist, for example by coating it onto the normally provided protective coating and laminating the coated surface to the photopolymerizable layer.

When the copying layer is applied to the copper surface from a solution, the procedure described on pages 4 and 5 of German Offenlegungsschrift No. 2,028,773, is followed.

When the copying layer is applied as a dry resist to the support to be modified, the process described in U.S. Pat. Nos. 3,622,334, and 3,645,772, is used. The transfer materials used are laminates composed of a dimensionally stable film base, the dry resist layer, and preferably a protective coating, such as those disclosed in U.S. Pat. No. 3,469,982, or German Offenlegungsschrift No. 2,123,702.

Plates or foils of copper or copper alloys, e.g. of brass, tombac, bronze, aluminum bronze, nickel silver, or Monel metal, may be used as the supports which are to be coated and modified. The plate or foil may be backed by a carrier of some other material, e.g. by an aluminum, steel, or plastic foil or a plate of insulating material, e.g. of a synthetic resin molding material. The products obtained by image-wise modification of the support, especially by etching or electroplating, may be used for the preparation of relief, gravure or planographic printing plates, for the manufacture of printed and integrated circuits, and for chemical milling.

The photopolymerizable layers used in the process according to the invention are composed of a high molecular weight binder, polymerizable unsaturated compounds, and photoinitiators.

Suitable polymerizable compounds are known and described, for example, in U.S. Pat. Nos. 2,760,863, and 3,060,023. Acrylic and methacrylic esters, such as diglycerol diacrylate, guaiacol glycerol ether diacrylate, neopentyl glycol diacrylate, 2,2-dimethylol-butanol-(3)-diacrylate, and the acrylates and methacrylates of polyesters of the "Desmophen" type containing hydroxy groups are preferred. Generally, those compounds are preferred which contain two or more polymerizable groups. Acrylic and especially methacrylic esters containing urethane groups are particularly suitable. Monomers of this type are described in German Offenlegungsschriften Nos. 2,064,079 and 2,361,041.

Further, the photopolymer layer contains at least one photoinitiator. Suitable initiators are, for example: hydrazones, five-membered nitrogen-containing heterocyclic compounds, mercapto compounds, pyrylium or thiopyrylium salts, multi-nuclear quinones, synergistic mixtures of different ketones, dye/redox systems, and certain acridine, phenazine and quinoxaline compounds.

Polyamides, polyvinyl esters, polyacrylic and polymethacrylic esters, polyvinyl acetals, and unsaturated polyesters may be used as binders, for example.

Preferably, the binders used should be soluble or at least swellable in aqueous-alkaline solutions, because layers containing such binders may be developed with the preferred aqueous-alkaline developers. Such binders may contain the following groups, for example: —COOH, —PO$_3$H$_2$, —SO$_3$H, —SO$_2$NH$_2$, —SO$_2$—NH—CO—, and similar groups. Examples of such binders are: maleinate resins, polymers of N-(p-tolylsulfonyl)-carbamic acid-($\beta$-methacryloyl-oxy-ethyl)-ester and copolymers of these and similar monomers with other monomers, styrene/maleic anhydride copolymers, and methyl methacrylate/methacrylic acid copolymers. Preferably, however, copolymers of methacrylic acid, alkyl methacrylates, and methyl methacrylate and/or styrene, acrylonitrile and the like are used, such as those disclosed in German Offenlegungsschriften Nos. 2,064,080 and 2,363,806.

Further, dyestuffs, pigments, polymerization inhibitors, color couplers, and hydrogen donors may be added to the copying layers.

If the adhesion-imparting substances are used as components incorporated in the copying layer, they are normally added in quantities from 0.05 to 5.0 percent by weight, based on the weight of the non-volatile components of the layer. The preferred quantity is in the range of about 0.1 to 2 percent by weight, especially between 0.4 and 1.5 percent by weight.

If the adhesion-imparting substances are applied as a separate layer to the copper support or to the surface of the copying layer, they are normally applied in the form of 0.1 to 5 percent solutions in organic solvents, or in mixtures of organic solvents with water, and then dried. It is important that the quantity of adhesion-imparting substance deposited be sufficient to form a homogeneous, coherent layer. The preferred concentration range is between about 0.15 and 2 percent by weight. Lower alkanols and ketones, for example, were found to be suitable solvents.

For performing the process of the invention, the copper-containing support is cleaned, degreased, and possibly roughened in known manner by a mechanical treatment and/or by etching. According to one embodiment of the invention, the adhesion-imparting substance is then applied in the form of a dilute solution and dried. The polymerizable layer is then applied on top of this layer, either from a solution or by dry lamination, applying pressure and heat. During further processing, the layer is exposed in known manner and the unexposed areas of the layer are removed by means of a developer, preferably an aqueous alkaline solution which may contain small quantities of organic solvents, if desired. In order to clean the bared areas of the copper support from traces of the layer or from other impurities which may be present, it may be advisable to subject the plate to a treatment with an oxidizing agent, for example an aqueous solution of ammonium peroxy disulfate. The copper surface is then etched in the normal manner, or metal is deposited in the bared areas by an electroplating or electroless plating process. The hardened photoresist layer is then removed in known manner by means of organic solvents and/or aqueous alkaline solutions.

According to another embodiment of the inventive process, the adhesion-imparting substance is applied together with the copying layer. In this case, the adhesion-imparting substance may be evenly distributed in the coating solution or in the pre-fabricated dry resist layer, or it may be present in the form of a separate layer disposed on the surface of the dry resist layer. Further processing is as described above.

The adhesion-imparting substances used according to the present invention effect an excellent adhesion between the hardened photopolymer layer and the copper support. The adhesion produced by the present invention exceeds that resulting from known adhesion-imparting agents. The adhesion is so good that the plates may be etched or electroplated in strongly acid baths without parts of the resist layer being undercut at the boundary surface or separated from the support. This advantage is particularly evident when strongly acid galvanic gold baths and very severe conditions are employed, for example twice the normal current density.

Surprisingly it was found, however, that after the etching or electroplating process, the resist layer may be removed more easily and rapidly than a comparable resist layer which had been produced without the use of the new adhesion-imparting substances. This is the case not only in the normal decoating by means of solvents; in the case of the preferred compounds having a long-chain alcohol component, the resist even may be peeled off mechanically, for example by applying a pressure-sensitive adhesive tape.

This easy peelability is a great convenience in the processing of the dry resist material, and so far neither materials containing adhesion-imparting agents nor materials without such agents have been known to possess this advantage. If traces of the layer should still be present in fine image areas after mechanical peeling or stripping, they can be easily removed by washing with solvents.

Some of the mercapto compounds used according to the invention as adhesion-imparting substances are new, others have already been described in the literature. The new compounds are obtained analogously to the preparation of the known compounds.

The esters are prepared by mixing 2-mercapto-acetic acid or 3-mercapto-propionic acid with an excess of the appropriate alcohol, a small quantity of concentrated sulfuric acid, and, if desired, an inert solvent, and heating the mixture for several hours with reflux in a nitrogen atmosphere, the water which forms being advantageously removed by azeotropic distillation. The reaction mixture is shaken out with water, and the ester obtained is purified by vacuum distillation (see "Chemical Abstracts," Vol. 41, 1947, No. 2722 g).

The following table contains examples of suitable adhesion-imparting substances:

TABLE

| No. of Compound | Designation | Fusion Point/Boiling Point |
| --- | --- | --- |
| 1 | 2-mercapto-acetic acid-1-ethyl-hexyl ester | BP: 237° C. |
| 2 | 2-mercapto-acetic acid-n-octylester | $BP_4$: 124° C. |
| 3 | 2-mercapto-acetic acid-isooctylester | $BP_{17}$: 125°–127° C. |
| 4 | 2-mercapto-acetic acid-decylester | $BP_8$: 148° C. |
| 5 | 2-mercapto-acetic acid-octadecylester | FP:≈25° C. |
| 6 | 3-mercapto-propionic acid-methylester | $BP_{15}$: 47°–48° C. |
| 7 | 3-mercapto-propionic acid-dodecylester | BP: 296° C. |
| 8 | 3-mercapto-propionic acid-octadecylester | FP:≈25° C. |
| 9 | 3-mercapto-propane-diol-(1,2) | $BP_1$: 99°–100° C. |

The following examples illustrate preferred embodiments of the inventive process and material. The relation between parts by weight and parts by volume is the same as between grams and millimeters. Percentages are by weight unless stated otherwise. The parts by weight of monomer units in the polymers are the quantities used during polymerization.

EXAMPLE 1

A solution of
5.6 parts by weight of the reaction product of 1 mole of 2,2,4-trimethyl-hexamethylene-diisocyanate and 2 moles of 2-hydroxy-ethyl-methacrylate,
7.0 parts by weight of a terpolymer of n-hexyl-methac-rylate, methyl methacrylate, and methacrylic acid (63:12:25) with an acid number of about 160,
0.2 part by weight of 9-phenyl-acridine,
0.015 part by weight of 4,4'-bis-dimethylamino-benzophenone,
0.15 part by weight of triethyleneglycol-dimethacrylate, and
0.04 part by weight of a blue azo dyestuff produced by coupling 2,4-dinitro-6-chloro-benzene diazonium salt with 2-methoxy-5-acetylamino-N-cyanoethyl-N-hydroxyethyl aniline, in
28.0 parts by weight of butanone-2 is whirler-coated onto a 25 μm thick polyethylene terephthalate film such that a 25 μm thick layer is produced (weight of the layer: 30 g/m$^2$). The layer is further dried for 2 minutes at 100° C. in a drying oven.

In order to protect the resulting layer from contamination by dust or from damage, it is covered with a 20 to 25 μm thick protective coating which adheres less strongly to the layer than does the polyester base. The resulting material may be stored in this form over a relatively long period of time.

The copper surface of a phenoplast plate laminated with a 25 μm thick copper foil is mechanically cleaned with pumice powder or a brushing device, thoroughly rinsed with water, and dried by blowing with oil-free air.

The plate cleaned in this manner is immersed for about 30 seconds in an adhesion-imparting bath containing 1 part by weight of the Compound No. 7 dissolved in 99 parts by weight of ethanol.

After immersion, the plate is dried with a hot-air blower and then stored for 5 minutes at 100° C. in a drying oven.

A very thin, oily film remains on the copper surface which cannot be rinsed off with water.

After peeling off the protective coating, the dry resist is laminated onto the copper plate pretreated in this manner, using a laminator, for example the laminator of Type 25, marketed by Dynachem Corporation, Santa Fé Springs, USA. The lamination pressure is adjusted to the highest value, the temperature to 115°-125° C., and the feed speed to 1.0 m per minute.

The light-sensitive layer is then exposed for about 20 seconds through the film base under a negative original, using a xenon lamp of Klimsch & Co., model Bikop, 8 kilowatts, from a distance of 80 cm.

After removal of the film base, the unhardened areas of the layer are washed away with a 0.4 percent sodium carbonate solution.

The developed plate is then successively subjected to the following treatments:

(a) Immersion in a 15 percent aqueous ammonium persulfate solution until a uniform copper surface is achieved, i.e. until all traces of fogging have disappeared (approximately 1 minute), followed by 30 seconds' rinsing with water.

(b) 30 seconds' immersion in 10 percent by weight sulfuric acid, followed by 30 seconds' rinsing with water.

The cleaned, bared areas of the copper surface are then electroplated as follows:

(c) 30 minutes' treatment, at 2 A/dm$^2$—based on the area to be copper-plated—with the "Feinkornkupferplastikbad" of Messrs. Schlötter, at a temperature of 20° to 25° C. and a pH value of less than 1, followed by 30 seconds' rinsing with water.

(d) 10 minutes' treatment, at 4 A/dm$^2$, in a nickel bath of type "Norma" of Messrs. Schlötter, at a temperature of 50° to 55° C. and a pH value between 3.5 and 4.5, followed by 30 seconds' rinsing with water.

(e) 15 minutes' treatment, at 0.6 A/dm$^2$, with the gold bath of type "Autronex-N" of Messrs. Bladberg, at a temperature of 20° to 25° C. and a pH value between 3.5 and 4.0, followed by 30 seconds' rinsing with water and drying.

For all electroplating baths, the current density may be doubled, if desired.

In order to remove the hardened areas of the resist, the plate may be successively immersed in a 5 percent caustic soda solution and in methylene chloride.

A sample of the plate which had not been treated with the adhesion-imparting substance cannot be decoated as quickly as a treated sample.

Apart from wet decoating with caustic soda solution and methylene chloride, it is also possible to remove the cross-linked areas of the resist by a dry peeling process. For this purpose, the entire plate is covered, after the electroplating process, with an adhesive tape, e.g. "Tesafilm" or the "Scotch-Electro-Insulating-Tape" of 3M Co., USA, taking care that no air bubbles are formed. When the adhesive tape is pulled off from one of the edges, the cross-linked polymer layer adheres to the tape and the copper areas originally covered by the cross-linked resist are bared and then may be etched.

In the case of excessive electroplating, i.e. when the electroplated layer is thicker than the resist so that the adhesive tape does not satisfactorily adhere to the resist in fine line areas, the residual traces of the resist may be washed away within a short time with acetone and the use of a washing bottle.

Then, the decoated plates are etched at a temperature of about 44° to 55° C. with an iron-III-chloride solution of 42° Bé, using either an etching machine or a rocking bath, then rinsed with water, and dried by blowing with compressed air. In this manner, the copper areas formerly covered by the resist are etched away.

Similar results are obtained when using an equal quantity of the Compounds Nos. 5 or 8 instead of the Compound No. 7 as the adhesion-imparting substance.

EXAMPLE 2

5.6 parts by weight of the monomeric acrylo compound described in Example 1, 10.0 parts by weight of a terpolymer of styrene, n-hexyl-methacrylate, and methacrylic acid (11.3:67.7:21) with an acid number of about 130, 0.2 part by weight of 9-phenyl-acridine, 0.018 part by weight of 4,4'-bis-dimethylamino-benzophenone, 0.15 part by weight of triethyleneglycol dimethacrylate, 0.05 part by weight of the blue azo dyestuff used in Example 1, and 0.03 part by weight of 3-mercapto-1,2-propione-diol (Compound No. 9), are dissolved in 22.5 parts by weight of butanone-2.

The resulting solution is whirler-coated onto a polyester film and covered with a protective coating of polyethylene. The plates to be laminated are cleaned and dried as described in Example 1, the pretreating bath being omitted, however.

Lamination, exposure, and development with 1 percent aqueous sodium silicate-nonahydrate solution and the subsequent pretreatment of the developed plate to make it ready for electroplating are as described in Example 1.

The plate is then electroplated in the baths described in Example 1, the conditions being as follows:

"Feinkornkupferplastikbad": 2 A/dm$^2$—25° C.—30 minutes.

Nickel bath, type "Norma": 4 A/dm$^2$—55° C.—10 minutes.

Gold bath "Autronex N": 1.2 A/dm$^2$—25° C.—15 minutes.

Even in the case of a double current density in the gold bath (normal density being 0.6 A/dm$^2$), no undercutting is observed. A mechanical stripping of the resist, as in Example 1, is not possible. Adhesion between the electroplated metal layer and the copper surface is very good.

After decoating with acetone, the plate may be etched in the normal manner, using an iron-III-chloride solution of 42° Bé.

EXAMPLE 3

The photopolymer layer described in Example 1 is laminated to a copper-phenoplast plate which had been cleaned as described in Example 1 and then immersed in a pretreating bath of the following composition:

0.2 part by weight of 3-mercapto-propionic-acid-dodecylester (Compound No. 7), 20.0 parts by weight of acetone, and 16.0 parts by weight of water.

After immersion, the plate is dried with a hot-air blower and placed for 5 minutes in a drying oven at 100° C. in order to remove a water film which may still be present.

The plate is then laminated, exposed, and developed as described in Example 1.

The pretreatment of the copper-phenoplast plate prior to electroplating and the various steps of the electroplating process are as described in Example 2.

After formation of the electroplated layer, the hardened polymer layer is pulled off from the copper surface by means of an adhesive tape.

If the conducting paths (of a printed circuit) are very close to each other (distance of less than 100 μm), the resist cannot be completely pulled off. In this case, an after-treatment with a small quantity of acetone, methylene chloride/caustic potash solution, or dimethyl formamide is necessary. After the etching process, which follows next (see Example 1) it is found that the metal did not penetrate under the hardened photopolymer layer.

EXAMPLE 4

A copper-phenoplast plate carrying a 35 μm thick copper layer is cleaned as in Example 1 and then immersed for 30 seconds in a pretreating bath of the following composition:

1.0 part by weight of 3-mercapto-propionic acid dodecyl ester (Compound No. 7) and
99.0 parts by weight of acetic acid ethyl ester.

The plate is then dried with a hot-air blower and then completely dried, laminated to a photopolymer layer, and further processed as described in Example 1.

After removing the resist with an adhesive tape and aftertreating with acetone, the plate was etched with an iron-III-chloride solution of 42° Bé.

Here again it was proved that the adhesion in the gold bath is excellent, even when twice the normal current density, i.e. 1.2 A/dm², is applied.

EXAMPLE 5

A solution of
5.6 parts by weight of the reaction product of 1 mole of hexamethylene-diisocyanate and 2 moles of hydroxypropyl-methacrylate,
10.0 parts by weight of a terpolymer of styrene, n-butylmethacrylate, and methacrylic acid (11.3:68.7:20) with an acid number of about 125,
0.05 part by weight of 9-phenyl-acridine,
0.15 part by weight of triethyleneglycol dimethacrylate,
0.012 part by weight of Fatty Red 5B (Hoechst AG, C.I. No. 26,125), and
0.1 part by weight of mercapto-acetic acid-decyl ester (Compound No. 4), in
30.0 parts by weight of butanone-2 is whirler-coated onto a 25 μm thick polyester film in such a manner that an 38 μm thick layer weighing 45 g/m² results.

After further drying for 3 minutes at 100° C. in a drying oven, the photopolymer layer is covered with a protective polyethylene coating for further storage.

The layer is exposed for 40 to 45 seconds as described in Example 1. Then it is developed within about 2 minutes with the following solution:

30.0 parts by weight of Na₂SiO₃.9H₂O,
0.53 part by weight of SrCl₂.8H₂O, in
970.0 parts by volume of water.

The subsequent procedure is as described in Example 2. The resist may be mechanically peeled off as described in Example 1.

The Compound No. 4 may be replaced by the same quantity of any of the Compounds Nos. 1, 2, or 3, the results being virtually the same.

It will be obvious to those skilled in the art that many modifications may be made within the scope of the present invention without departing from the spirit thereof, and the invention includes all such modifications.

What is claimed is:

1. In a photopolymerizable transfer material comprising a flexible base, and a thermoplastic photopolymerizable copying layer, said layer comprising
   (a) a thermoplastic polymeric binder,
   (b) a photopolymerizable acrylic or methacrylic ester which boils at a temperature of at least 100° C. and which contains at least one terminal, ethylenically unsaturated group, and
   (c) a photoinitiator activatable by actinic radiation, weight, based on the weight of the non-volatile components of the layer, of an adhesion-imparting substance effective to improve adhesion to copper or copper-alloys evenly distributed in the photopolymerizable copying layer and/or havng said adhesion-imparting substance in a separate, homogeneous, coherent layer on top of said copying layer on the opposite side of said flexible base, said adhesion-imparting substance having the formula

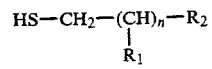

in which
n is 0 or an integer from 1 to 3,
R₁ is H or OH,
R₂ is H or COOR₃, and R₃ is an alkyl group having from 1 to 25 carbon atoms.

2. A photopolymerizable transfer material according to claim 1 including a peelable protective coating on the side of the copying layer away from the base.

3. A photopolymerizable transfer material according to claim 1 in which the copying layer contains a polymeric binder which is soluble or swellable in aqueous-alkaline solutions.

4. A photopolymerizable transfer material according to claim 1 in which the copying layer is in the form of a dry, pre-fabricated layer.

5. A photopolymerizable transfer material according to claim 1 in which the adhesion-imparting substance is 2-mercapto-acetic acid-1-ethyl-hexyl-ester.

6. A photopolymerizable transfer material according to claim 1 in which the adhesion-imparting substance is 2-mercapto-acetic acid-n-octylester.

7. A photopolymerizable transfer material according to claim 1 in which the adhesion-imparting substance is 2-mercapto-acetic acid-isooctylester.

8. A photopolymerizable transfer material according to claim 1 in which the adhesion-imparting substance is 2-mercapto-acetic acid-decylester.

9. A photopolymerizable transfer material according to claim 1 in which the adhesion-imparting substance is 2-mercapto-acetic acid-octadecylester.

10. A photopolymerizable transfer material according to claim 1 in which the adhesion-imparting substance is 3-mercapto-propionic acid-methylester.

11. A photopolymerizable transfer material according to claim 1 in which the adhesion-imparting substance is 3-mercapto-propionic acid-dodecylester.

12. A photopolymerizable transfer material according to claim 1 in which the adhesion-imparting substance is 3-mercapto-propionic acid-octadecylester.

13. A photopolymerizable transfer material according to claim 1 in which the adhesion-imparting substance is 3-mercapto-propane-diol-(1,2).

UNITED STATES PATENT AND TRADEMARK OFFICE
CERTIFICATE OF CORRECTION

PATENT NO. : 4,233,395
DATED : November 11, 1980
INVENTOR(S) : Kurt Klüpfel and Heide Sprengel It is certified that error appears in the above—identified patent and that said Letters Patent is hereby corrected as shown below:

In the Abstract, penultimate line, "or" should read --- to ---.

Column 1, line 43, "closed" should read --- coated ---.

Column 6, line 19, "millimeters" should read --- milliliters ---.

Column 6, line 30, "methac-rylate," should read --- methacrylate, ---.

Column 10, line 10 of claim 1, before "weight", the following has been omitted: --- the improvement comprising including about 0.05 to 5.0 per cent by ---

Signed and Sealed this

Third Day of March 1981

[SEAL]

Attest:

RENE D. TEGTMEYER

Attesting Officer

Acting Commissioner of Patents and Trademarks